(12) United States Patent
Min et al.

(10) Patent No.: US 8,012,828 B2
(45) Date of Patent: Sep. 6, 2011

(54) RECESS GATE TRANSISTOR

(75) Inventors: Ji-Young Min, Suwon-si (KR); Si-Hyung Lee, Suwon-si (KR); Heedon Hwang, Seoul (KR); Si-Young Choi, Seongnam-si (KR); Sangbom Kang, Seoul (KR); Dongsoo Woo, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 205 days.

(21) Appl. No.: 12/251,054

(22) Filed: Oct. 14, 2008

(65) Prior Publication Data

US 2009/0173994 A1    Jul. 9, 2009

(30) Foreign Application Priority Data

Jan. 7, 2008  (KR) .................. 10-2008-0001753

(51) Int. Cl.
*H01L 21/336* (2006.01)
(52) U.S. Cl. ................ 438/259; 438/270; 257/E21.419; 257/E21.429; 257/E21.428
(58) Field of Classification Search .................. 438/243, 438/259, 589, 277, 269, 270, 258; 257/211, 257/330, 192, 530, E29.255, E29.26, E29.258, 257/E21.655, E21.345, E21.427, E21.43, 257/E21.429, E21.428, E21.419, E21.384, 257/E21.41, E27.084, E21.42
See application file for complete search history.

(56) References Cited

U.S. PATENT DOCUMENTS

| | | | |
|---|---|---|---|
| 6,683,346 B2 | 1/2004 | Zeng | |
| 6,987,040 B2 | 1/2006 | Venkatraman | |
| 7,199,010 B2 | 4/2007 | Hijzen et al. | |
| 7,586,152 B2* | 9/2009 | Lee et al. | 257/330 |
| 7,633,109 B2* | 12/2009 | Lee et al. | 257/300 |
| 7,723,755 B2* | 5/2010 | Lee et al. | 257/211 |
| 2002/0127795 A1* | 9/2002 | Shih | 438/243 |
| 2003/0170955 A1* | 9/2003 | Kawamura et al. | 438/270 |
| 2006/0138474 A1 | 6/2006 | Yu et al. | |
| 2006/0270154 A1* | 11/2006 | Yamazaki | 438/253 |
| 2007/0010058 A1* | 1/2007 | Juengling | 438/259 |
| 2007/0048941 A1* | 3/2007 | Tang et al. | 438/259 |
| 2007/0059889 A1* | 3/2007 | Yoo et al. | 438/282 |

(Continued)

FOREIGN PATENT DOCUMENTS

JP    2006510217    3/2006

(Continued)

*Primary Examiner* — Matthew C Landau
*Assistant Examiner* — Latanya Crawford
(74) *Attorney, Agent, or Firm* — F. Chau & Associates, LLC

(57) ABSTRACT

A recess gate of a semiconductor device is provided, comprising: a substrate having a recess formed therein; a metal layer formed at the bottom of the recess; a polysilicon layer formed over the metal layer; and a source region and a drain region formed adjacent to the polysilicon layer and spaced from the metal layer. A method of forming a semiconductor device is also provided, comprising forming a substrate and a source and drain layer; forming a recess and depositing a gate insulation layer therein; forming a first conductive layer on the gate insulation layer; forming a first conductive layer pattern by recessing the first conductive layer; forming a second conductive layer on the first conductive layer pattern; forming a second conductive layer pattern by patterning the second conductive layer to overlap the source and drain layer; depositing an insulating layer on the second conductive layer pattern and the source and drain layer; and planarizing the insulating layer to form a cap on the second conductive layer pattern.

9 Claims, 14 Drawing Sheets

U.S. PATENT DOCUMENTS

| | | | |
|---|---|---|---|
| 2007/0262395 A1* | 11/2007 | Gibbons et al. | 257/392 |
| 2007/0262415 A1* | 11/2007 | Smith et al. | 257/530 |
| 2007/0264771 A1* | 11/2007 | Ananthan et al. | 438/243 |
| 2007/0296031 A1* | 12/2007 | Tanaka | 257/330 |
| 2009/0140307 A1* | 6/2009 | Baars et al. | 257/296 |

FOREIGN PATENT DOCUMENTS

| | | |
|---|---|---|
| JP | 2006190947 | 7/2006 |
| JP | 2006332211 | 12/2006 |
| JP | 2007-110110 | 4/2007 |
| JP | 2003023104 | 10/2008 |
| KR | 2004079518 | 10/2004 |
| KR | 1020050085607 | 8/2005 |
| KR | 2005115822 | 11/2005 |
| KR | 100562657 | 3/2006 |
| KR | 1020070077390 | 7/2007 |

* cited by examiner

| Gate Height | VT | Ion | DIBL | Ioff | GIDL | JLKG |
|---|---|---|---|---|---|---|
| 500A | 1.055 | 3.68E-07 | 0.017 | 1.30E-16 | 3.16E-16 | 4.86E-16 |
| 1000A | 1.076 | 3.82E-07 | 0.016 | 2.66E-15 | 1.27E-14 | 4.36E-16 |
| 1500A | 1.078 | 3.82E-07 | 0.016 | 4.06E-13 | 8.49E-13 | 4.32E-16 |

US 8,012,828 B2

RECESS GATE TRANSISTOR

CROSS-REFERENCE TO RELATED APPLICATIONS

This application claims priority under 35 USC §119 to Korean Patent Application No. 10-2008-0001753, filed on Jan. 7, 2008, in the Korean Intellectual Property Office (KIPO), the disclosure of which is incorporated by reference herein in its entirety.

TECHNICAL FIELD

The present disclosure relates to semiconductor technology; more particularly, to a recess gate and a method of fabricating a semiconductor device with the same.

DISCUSSION OF RELATED ART

Recess Channel Array Transistors (RCATs) and Buried Channel Array Transistors (BCATs) have improved operation characteristics as compared to planar transistors and are therefore widely used in semiconductor devices including memory devices. For example, planar transistors have shorter conduction channels compared to RCATs or BCATs and their threshold voltages are more difficult to control. As an example, when planar transistors are used in a DRAM device, more refresh operations may be required due to the short channel effect (SCE). RCATs and BCATs have increased channel lengths, decreased leakage effects, but also decreased drive current. Gate induced drain leakage (GIDL) may also render the integrated circuit to operate at voltages which are lower than desired for best performance. GIDL results from the generation of electron-hole pairs in the surface of the depletion region along the area where the gate conductor overlaps the drain diffusion region when the device is biased such that the drain potential is more positive than the gate potential. In logic circuits, GIDL increases standby power. In a DRAM array MOSFET, GIDL acts to increase the potential between the drain and the gate conductor when DRAM array MOSFETS are operated at negative wordline low levels or with an opposite gate doping polarity (i.e. P+ gated N-type field effect transistor (NFET)). GIDL also degrades data retention time in DRAM MOSFETs. The materials used to form the MOSFET affects the electrical characteristics, including the drive current and GIDL.

Work function of materials used also affects the threshold voltage of the BCAT. When doped polysilicon, a semiconductive material, is used to form the components of a transistor gate, it tends to experience the formation of a depletion region adjacent to the interface between the gate electrode and the gate insulator when a voltage is applied to the gate electrode. As device scaling has substantially reduced the thickness of the gate insulator layer, the width of the depletion region in the doped polysilicon gate electrode has come to play a more significant role in determining the electrical characteristics of the transistor. The occurrence of this depletion region in the gate electrode tends to degrade transistor performance. If polysilicon is replaced with other materials, there may be work function mismatch and impurity diffusion issues. Work function is determined by the electronic and structural properties of a material.

SUMMARY OF THE INVENTION

According to an exemplary embodiment of the present invention, a recess gate of a semiconductor device is provided, comprising: a substrate having a recess formed therein; a metal layer formed at the bottom of the recess; a polysilicon layer formed over the metal layer; and a source region and a drain region formed adjacent to the polysilicon layer and spaced from the metal layer. The recess gate may be part of an NMOS device and the metal layer has a workfunction equal to or greater than a workfunction of the polysilicon layer. Alternatively, the recess gate may be part of a PMOS device and the metal layer has a workfunction equal to or less than a workfunction of the polysilicon layer. According to an embodiment of the invention, the metal layer is selected from a group consisting of Ti, TiN, W, WN, Ta, TaN, Co, C, Rb, or Ru. The metal layer has a thickness of about 500 angstrom (A.) to about 1,500 A. The thickness of the polysilicon layer may be equal to or greater than the thickness of the metal layer.

A recess gate of a semiconductor device, comprising: a substrate having a recess formed therein; a first conductive layer formed at the bottom of the recess; a second conductive layer formed over the first conductive layer; and a source region and a drain region formed adjacent to the second conductive layer and spaced from the first conductive layer. The recess gate is part of an NMOS device and the first conductive layer has a workfunction equal to or greater than a workfunction of the second conductive layer. The recess gate is part of a PMOS device and the first conductive layer has a workfunction equal to or less than a workfunction of the second conductive layer. The first conductive layer is selected from a group consisting of Ti, TiN, W, WN, Ta, TaN, Co, C, Rb, or Ru. The first conductive layer has a thickness of about 500 A. to about 1,500 A. The second conductive layer is polysilicon or a metallic material. The second conductive layer is equal to or greater than the thickness of the first conductive layer. An ohmic layer can be formed above the second conductive layer, and a capping metal layer can be formed on the second conductive layer or the ohmic layer.

According to another exemplary embodiment of the present invention, a method of forming a semiconductor device is provided, comprising: forming a substrate and a source and drain layer; forming a recess and depositing a gate insulation layer therein; forming a first conductive layer on the gate insulation layer; forming a first conductive layer pattern by recessing the first conductive layer; forming a second conductive layer on the first conductive layer pattern; and forming a second conductive layer pattern by patterning the second conductive layer. The first conductive layer pattern may be metallic and the second conductive layer pattern may be polysilicon. According to an alternative embodiment, an ohmic layer may be formed on the second conductive layer pattern; and a capping metal layer may be formed on the second conductive layer pattern or the ohmic layer. The second conductive layer pattern includes a portion disposed adjacent to the source and drain layer and the first conductive layer pattern is disposed spaced apart from the source and drain layer. According to still another embodiment of the invention, the first conductive layer pattern and the second conductive layer pattern may both be metallic.

According to an exemplary embodiment of the present invention, the source and drain layer and the recess form a part of an NMOS device and the first conductive layer pattern has a workfunction equal to or greater than a workfunction of the second conductive layer pattern. Alternatively, the source and drain layer and the recess is part of a PMOS device and the first conductive layer pattern has a workfunction equal to or less than a workfunction of the second conductive layer pattern. The first conductive layer may be selected from a group consisting of Ti, TiN, W, WN, Ta, TaN, C, Co, or Ru. The first conductive layer pattern has a thickness of about 500 angstrom to about 1,500 angstrom. The thickness of the second conductive layer pattern may be equal to or greater than the thickness of the first conductive layer pattern According to still another embodiment of the present invention, a method of forming a semiconductor device further includes: depositing an insulating layer on the second conductive layer pattern; etching the insulating layer to expose the second conductive layer pattern and form a spacer layer adjacent to the source and drain layer; and forming a third conductive layer on the second conductive layer pattern and the spacer layer. The spacer layer may be an oxide or a nitride. The first conductive layer pattern may be a metal and the second conductive layer pattern may be a polysilicon. The first conductive layer pattern and the second conductive layer pattern may both be metallic.

According to still another exemplary embodiment of the present invention, a method of forming a semiconductor device is provided, comprising: forming a substrate and a source and drain layer; forming a recess and depositing a gate insulation layer therein; forming a first conductive layer on the gate insulation layer; forming a first conductive layer pattern by recessing the first conductive layer; forming a second conductive layer on the first conductive layer pattern; forming a second conductive layer pattern by patterning the second conductive layer to overlap the source and drain layer; depositing an insulating layer on the second conductive layer pattern and the source and drain layer; and planarizing the insulating layer to form a cap on the second conductive layer pattern. The first conductive layer pattern is metallic and the second conductive layer pattern is polysilicon. The second conductive layer pattern includes a portion disposed adjacent to the source and drain layer and the first conductive layer pattern is disposed spaced apart from the source and drain layer.

BRIEF DESCRIPTION OF THE DRAWINGS

The above and other features of the present invention will become better understood with respect to the following description of the exemplary embodiments given in conjunction with the accompanying drawings, in which.

DETAILED DESCRIPTION OF EXAMPLARY EMBODIMENTS

Figure 1:
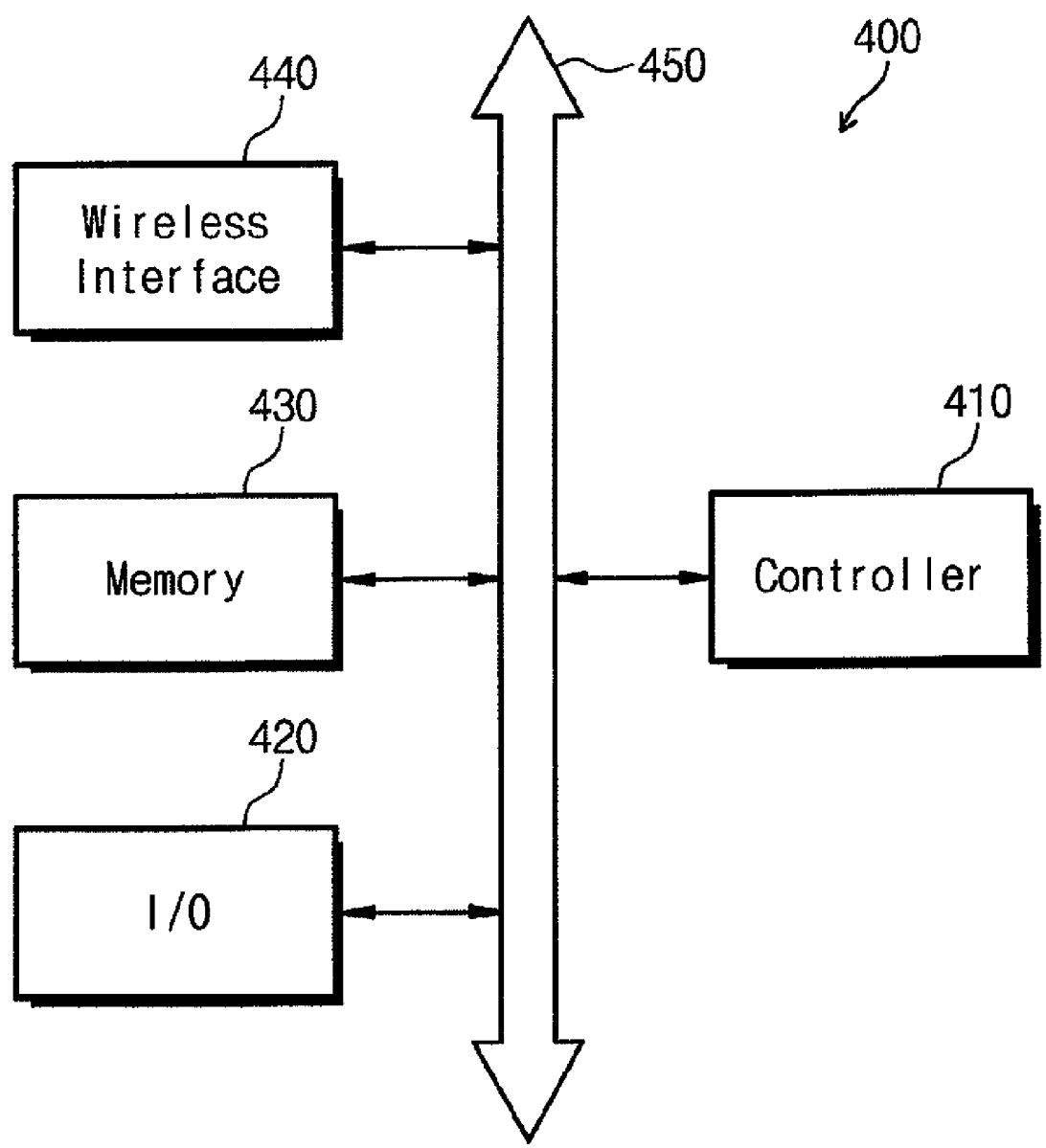
FIG. 1 is a block diagram illustrating an electron device having a semiconductor device according to an examplary embodiment of the present invention.

A recess gate and a method for fabricating a semiconductor device with the same in accordance with preferred embodiments of the present invention will be described in detail with reference to the accompanying drawings. According to at least one embodiment of the present invention, a first conductive material and a second conductive material are used in a RCAT or a BCAT gate to improve transistor drive characteristics while maintaining GIDL at a reduced level. A second conductive material can be selected to better interface with the source and drain areas of the gate. This invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. It will also be understood that when an element is referred to as being "connected" or "coupled" to another element, it can be directly connected or coupled to the other element or intervening elements may be present. Although the terms first, second, etc. may be used herein to describe various elements, components, regions, layers and/or sections, these elements, components, regions, layers and/or sections should not be limited by these terms. These terms are only used to distinguish one element, component, region, layer or ection from another region, layer or section. Thus, a first element, component, region, layer or section discussed below could be termed a second element, component, region, layer or section without departing from the teachings of the present invention. Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the Figures. For example, if the device in the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Some embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention. It will also be appreciated by those of skill in the art that references to a structure or feature that is disposed "adjacent" another feature may have portions that overlap or underlie the adjacent feature.

Figure 2:
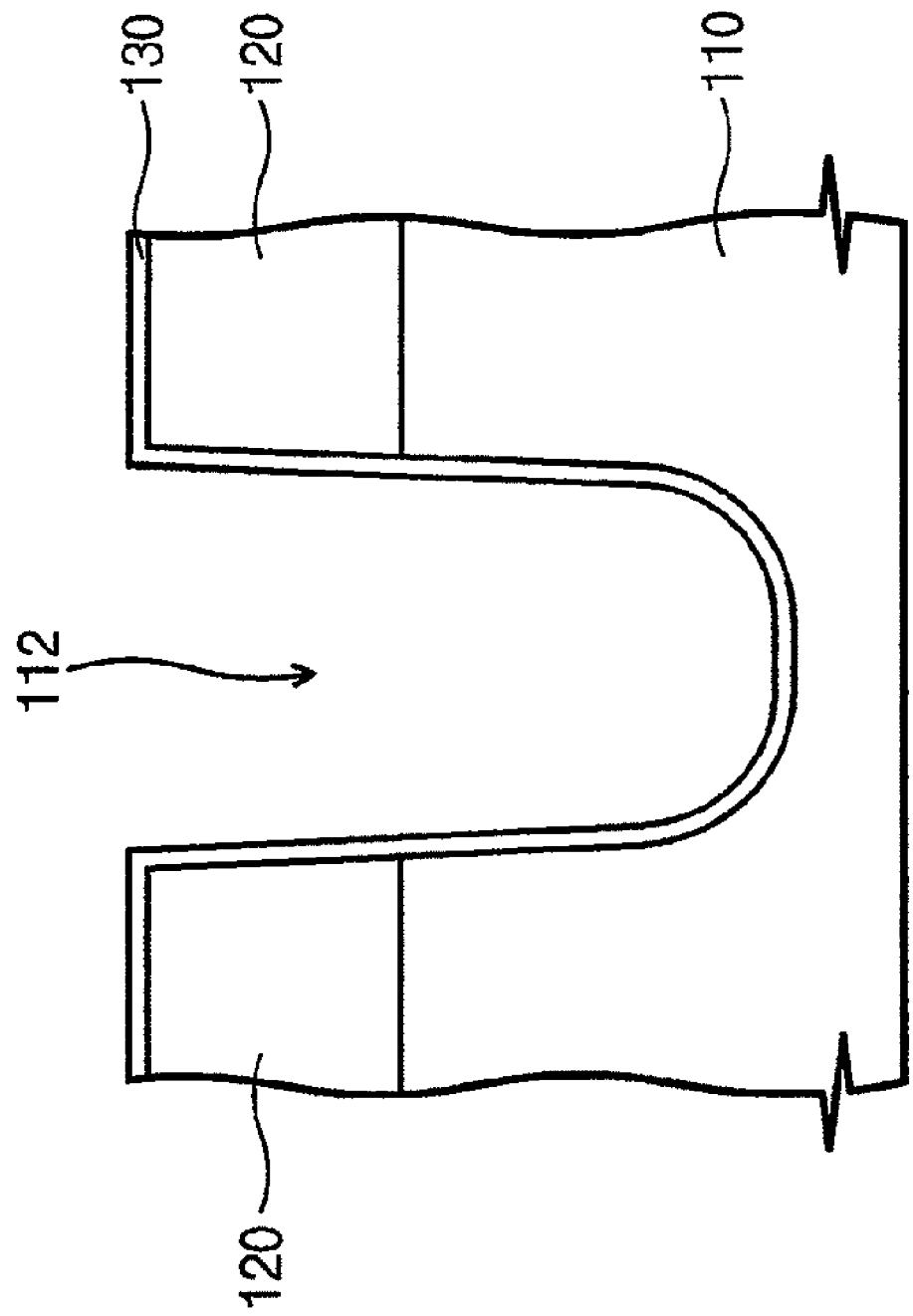
FIGS. 2 to 7 are cross-sectional views showing a semiconductor device with recess gates in accordance with an exemplary embodiment of the present invention.

FIG. 2 is a cross-sectional view showing a semiconductor device with a recess gate in accordance with an exemplary embodiment of the present invention.

As shown, a substrate 110 based on a semiconductor material such as silicon is first formed; a recess 112 is formed with a predetermined depth in a portion of the substrate 110; a source and drain layer 120 is formed on the substrate 110; then a gate insulation layer 130 is deposited along the sidewalls of the recess 112 and on top of the source and drain layer 120.

Figure 3:
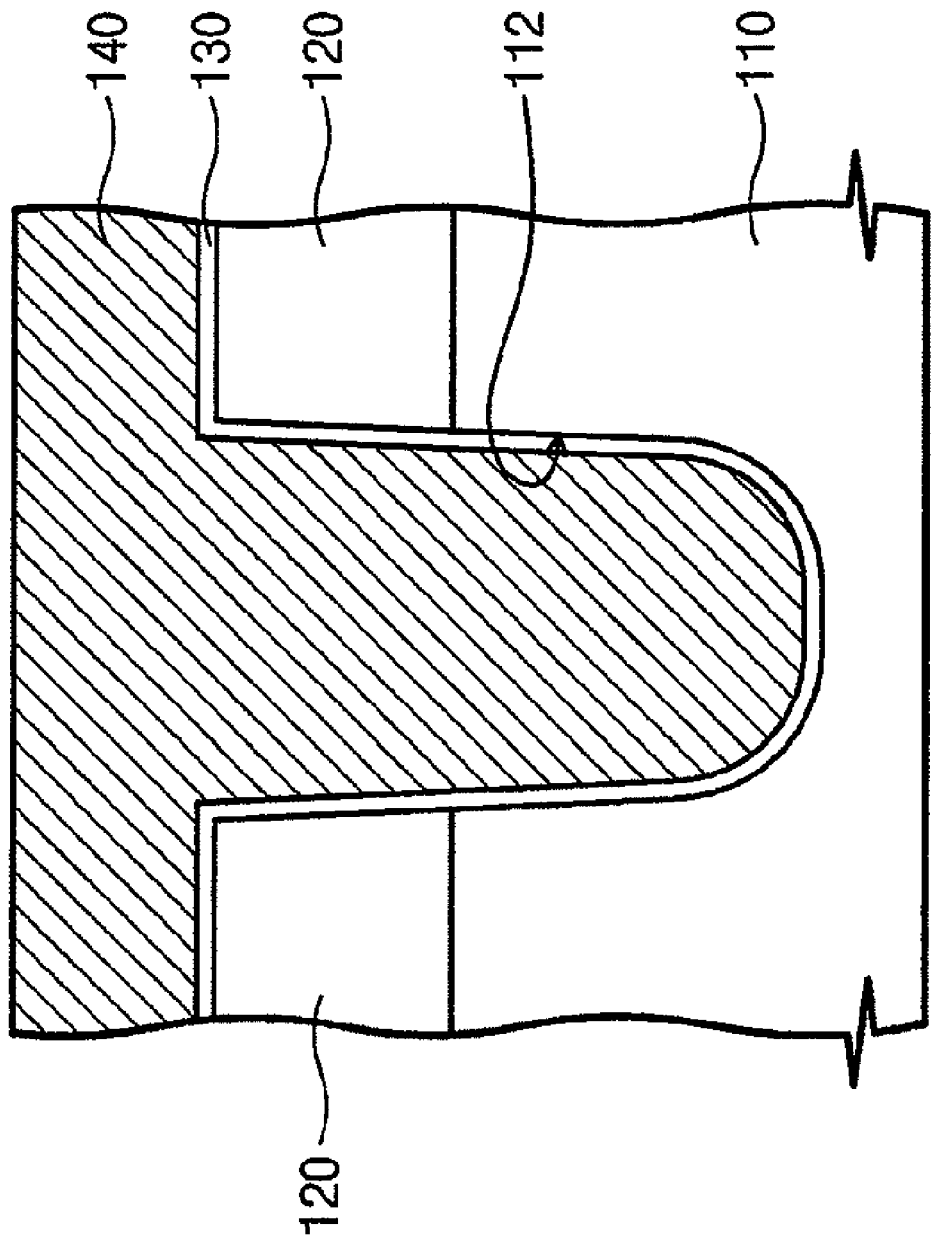
Figures 11, 12:
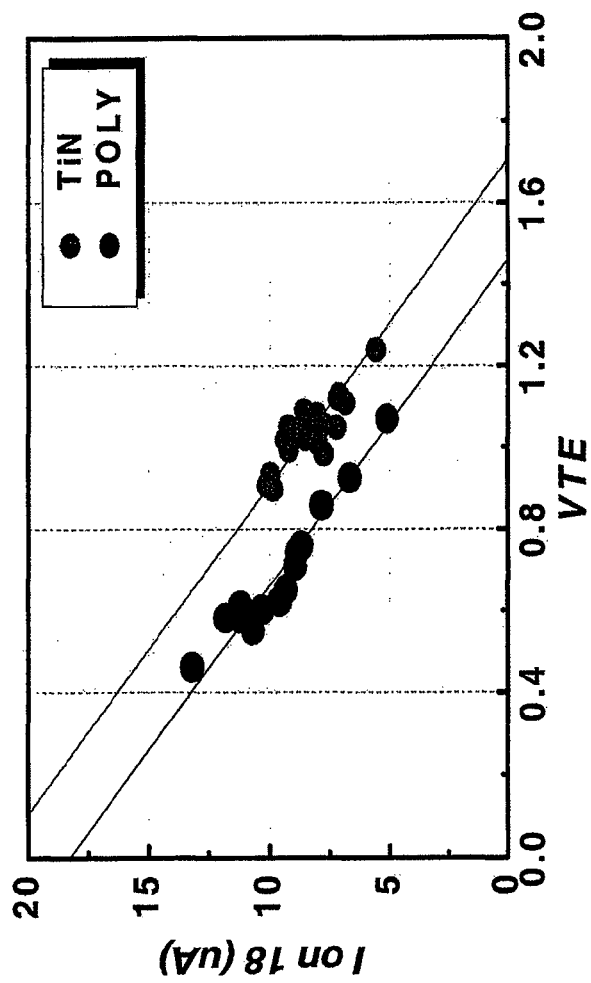
FIG. 11 shows a graph of materials and current characteristics.
FIG. 12 shows a table of electrical characteristics applicable to a recess gate according to an exemplary embodiment of the present invention.

Referring to FIG. 3, the recess 112 is filled with a first conductive layer 140, which forms over the gate insulation layer 130. The first conductive layer is formed by using a material selected from a group consisting of Ti, TiN, W, WN, Ta, TaN, Co, C, Ru, or Rb. It is noted that the workfunction of the first conductive layer materials is generally higher than that of polysilicon, the material that can be used to fill the recess 112. According to an exemplary embodiment, titanium nitride, TiN, is used as a first conductive material to fill a lower portion of the recess 112. TiN has a workfunction of about 4.6. As a comparison, n-type polysilicon has a workfunction of about 4.1 given the same dimensions under the same environmental conditions. FIG. 11 shows a graphic of Ion current characteristics for the materials TiN and polysilicon. As can be seen, given the same threshold voltages applied to a recess gate, the Ion current is higher when TiN is the material used as the first conductive layer 140 as compared to use of polysilicon as the first conductive layer. The first conductive layer 140 can be formed by one of sputtering, Chemical Vapor Deposition (CVD), Atomic Layer Deposition (ALD), or like processes.

Figure 4:
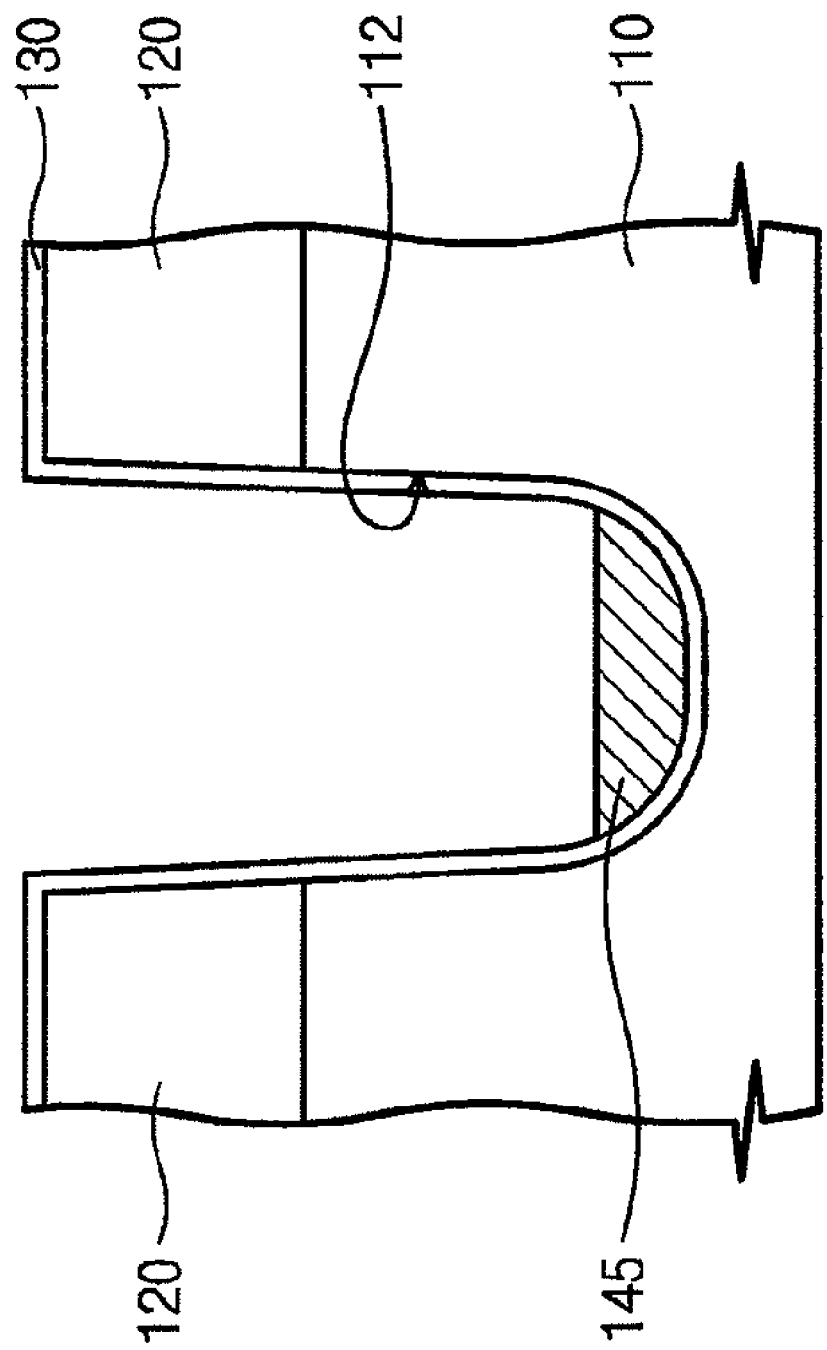

Referring to FIG. 4, a first conductive layer pattern 145 is obtained by etching back the first conductive layer 140. The first conductive layer pattern 145 thus occupies the bottom portion of the recess 112. According to an exemplary embodiment of the present invention, the first conductive layer pattern 145 has a thickness that ranges between about 500 A. to about 1,500 A., from a thin pattern filling the rounded bottom portion of the recess 112 to a pattern having a top surface that approaches close to the bottom of the source and drain layer 120. A gap of a predetermined length therefore exists between the first conductive layer pattern 145 and the source and drain layer 120.

Figure 5:
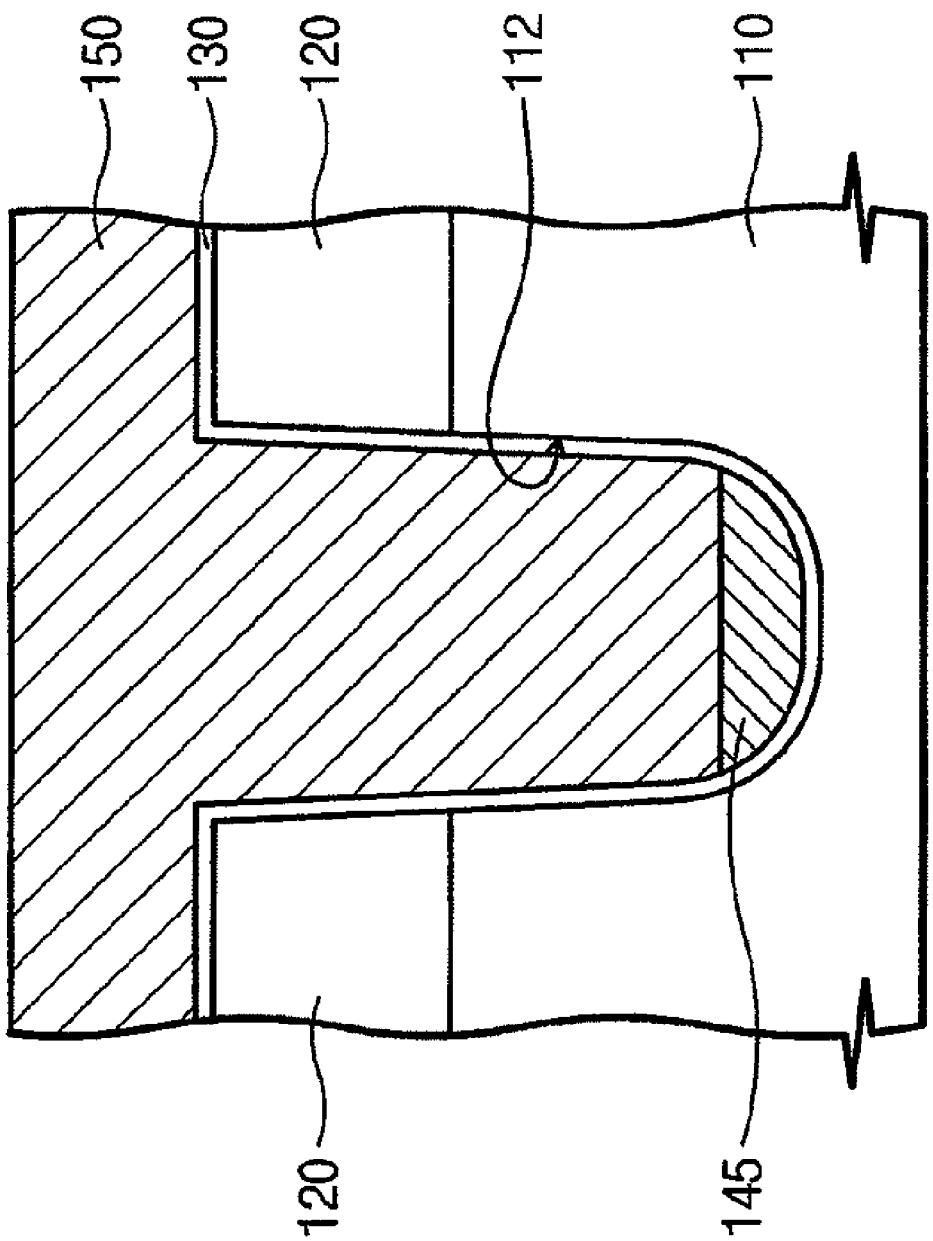
Figure 6:
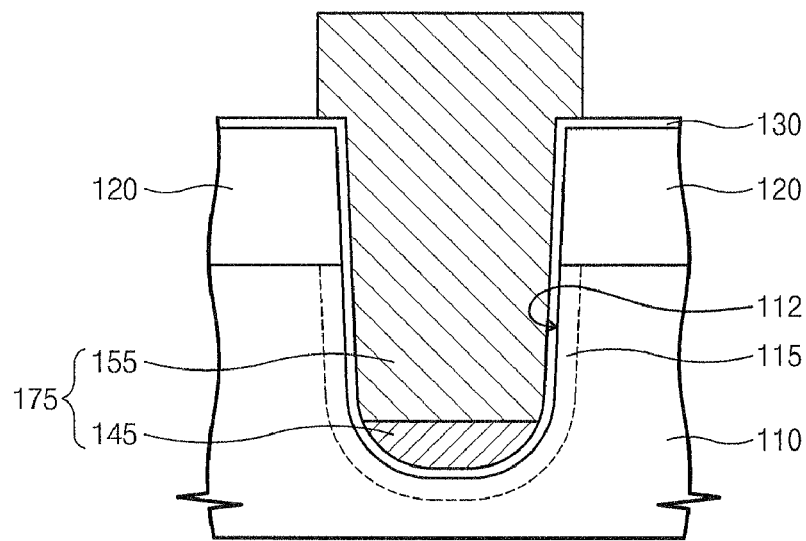

Referring to FIG. 5, a second conductive layer 150 is deposited on the first conductive layer pattern 145 and the gate insulation layer 130, filling the recess 112. Referring to FIG. 6, a second conductive layer pattern 155 is obtained by patterning the second conductive layer 150 to have a portion filling the entire portion of recess 112 above the first conductive layer pattern 145, and extending to a thickness above the top of the gate insulation layer 130. The entire thickness of the first conductive layer pattern 145, along with a portion of the second conductive layer pattern 155 adjacent to the first conductive layer pattern 145, forms a channeling region 175. During operation, the conductive materials of the channeling region 175 acts to diffuse the source and drain via a channel area 115 that exists along the exterior profile of the recess 112 in the vicinity beneath the source and drain layer 120. According to an exemplary embodiment of the present invention, the second conductive layer 150 is formed using an n-type or a p-type polysilicon material. Alternatively, the second conduction layer 150 can be formed using a metallic material from a group consisting of Ti, TiN, W, WN, Ta, TaN, Co, C, Rb, or Ru.

According to an embodiment of the present invention, the second conductive layer 150 has a workfunction that can be less than or greater than the workfunction of the first conductive layer pattern 145, depending on whether the recess gate thus formed is part of an NMOS device or a PMOS device. For example, if the recess gate is part of an NMOS device, the polysilicon used for the second conductive layer 150 has a workfunction less than or equal to that of the first conductive layer pattern 145. Conversely, if the recess gate is part of a PMOS device, the polysilicon used for the second conductive layer 150 has a workfunction that is equal or greater than that of the first conductive layer pattern 145. According to this exemplary embodiment of the present invention, the thickness of the second conductive layer pattern 155 is greater than the thickness of the first conductive layer pattern 145. According to an alternative embodiment of the present invention, the thickness of the first conductive layer pattern 145 can be equal to or greater than the thickness of the second conductive layer pattern 155.

Figure 7:
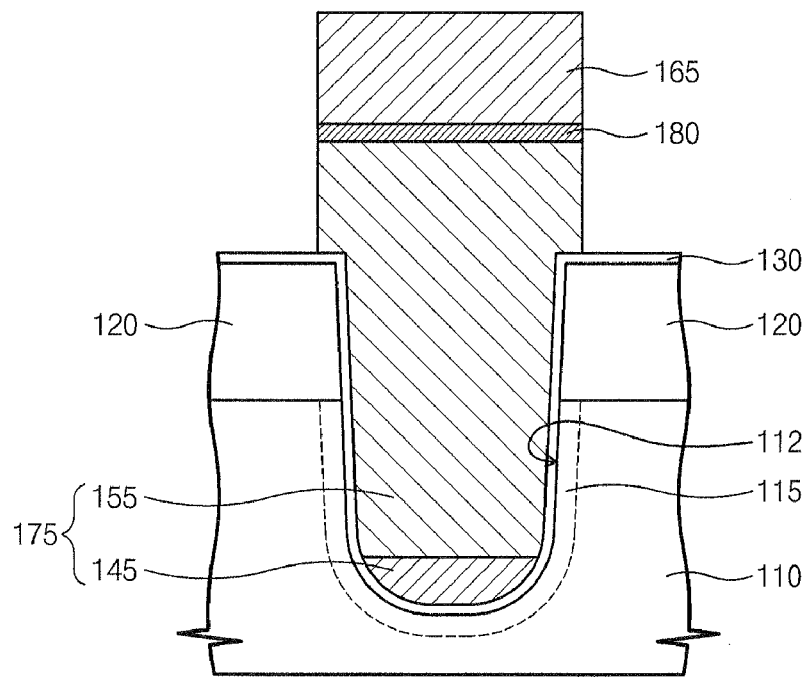

Referring to FIG. 7, according to an exemplary embodiment of the present invention wherein the second conductive layer 150 is formed using polysilicon, a capping metal layer 165 is formed above the second conductive layer pattern 155 to cap the polysilicon material. The capping metal layer 165 can be formed using material from a group consisting of Ti, TiN, Ta, TaN, W, or WN. According to an alternative embodiment of the present invention, an additional ohmic pattern (not shown) can be formed on the second conductive layer pattern 155 prior to forming the capping metal layer 165. The ohmic layer is made of material from a group consisting of TiSi, Ta, TaSi, Co, CoSi, or WSi.

FIG. 12 is a table showing the electrical characteristics of an exemplary recess gate according to the present invention wherein the first conductive layer is formed using TiN and the second conductive layer is formed using polysilicon. The table shows parameters such as threshold voltage VT, gate current Ion, drain induced barrier lowering DIBL, standby current Ioff, GIDL, and JLKG for different gate heights that approximate the thickness of the first conductive pattern. For example, the GIDL is seen to be the lowest for the smallest gate height of 500 A. This correlates with the lowest standby current Ioff, but the threshold voltage VT and the gate current Ion are also lowest. The thickness of the source and drain area, which is approximately the thickness of the source and drain layer plus the thickness of the gap between the source and drain layer and the first conductive pattern, is about 1,000 A.

According to a recess gate formed according to an alternative embodiment of the present invention, the first conductive layer is formed using a metal from one of a material in a group consisting of Ti, TiN, W, WN, Ta, TaN, Co, C, Ru, or Rb. The second conductive layer is also formed using a metal from one of a material in a group consisting of Ti, TiN, W, WN, Ta, TaN, Co, C, Ru, or Rb.

Figure 8A:
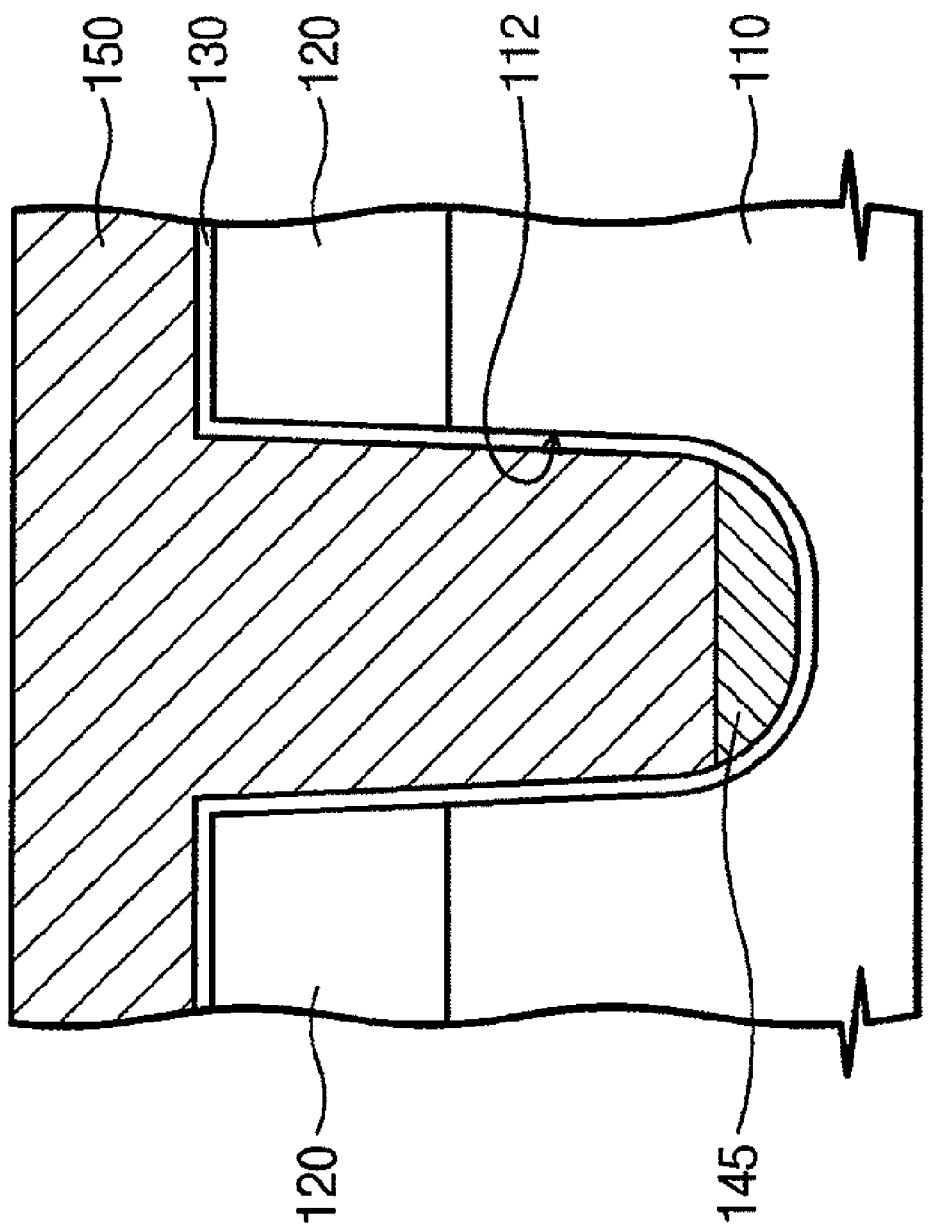
FIGS. 8A to 8D are cross-sectional views illustrating a method for fabricating recess gates in accordance with an exemplary embodiment of the present invention.
Figure 8B:
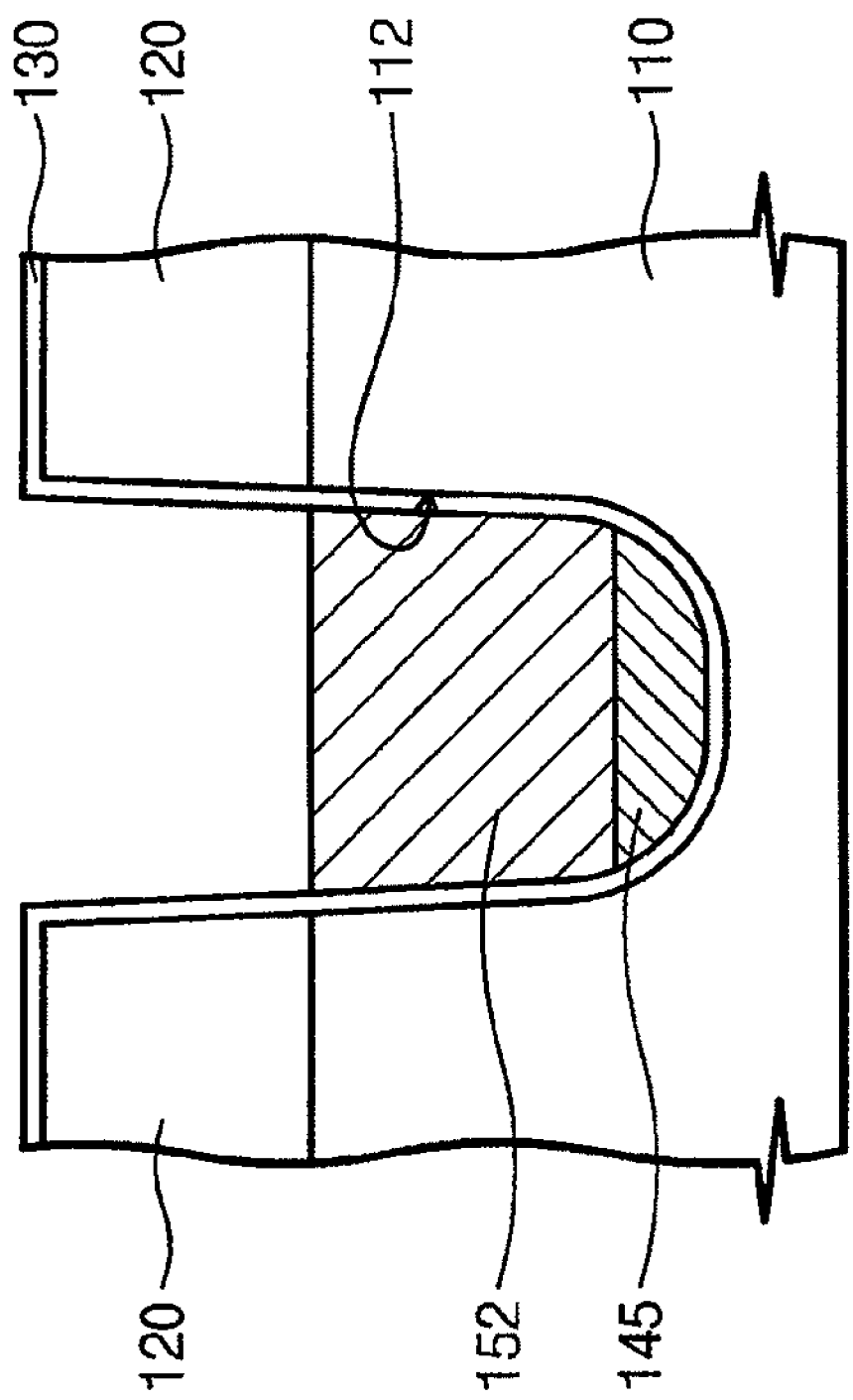

FIGS. 8a to 8d show a process for forming a gate insulation spacer according to one or more embodiment of the present invention. Referring to FIGS. 8a and 8b, the second conductive layer 150 is patterned by etch back to form a second conductive layer pattern 152 that has a top surface beneath the top of the recess 121, at a height near the bottom of the source and drain layer 120.

Figure 8C:
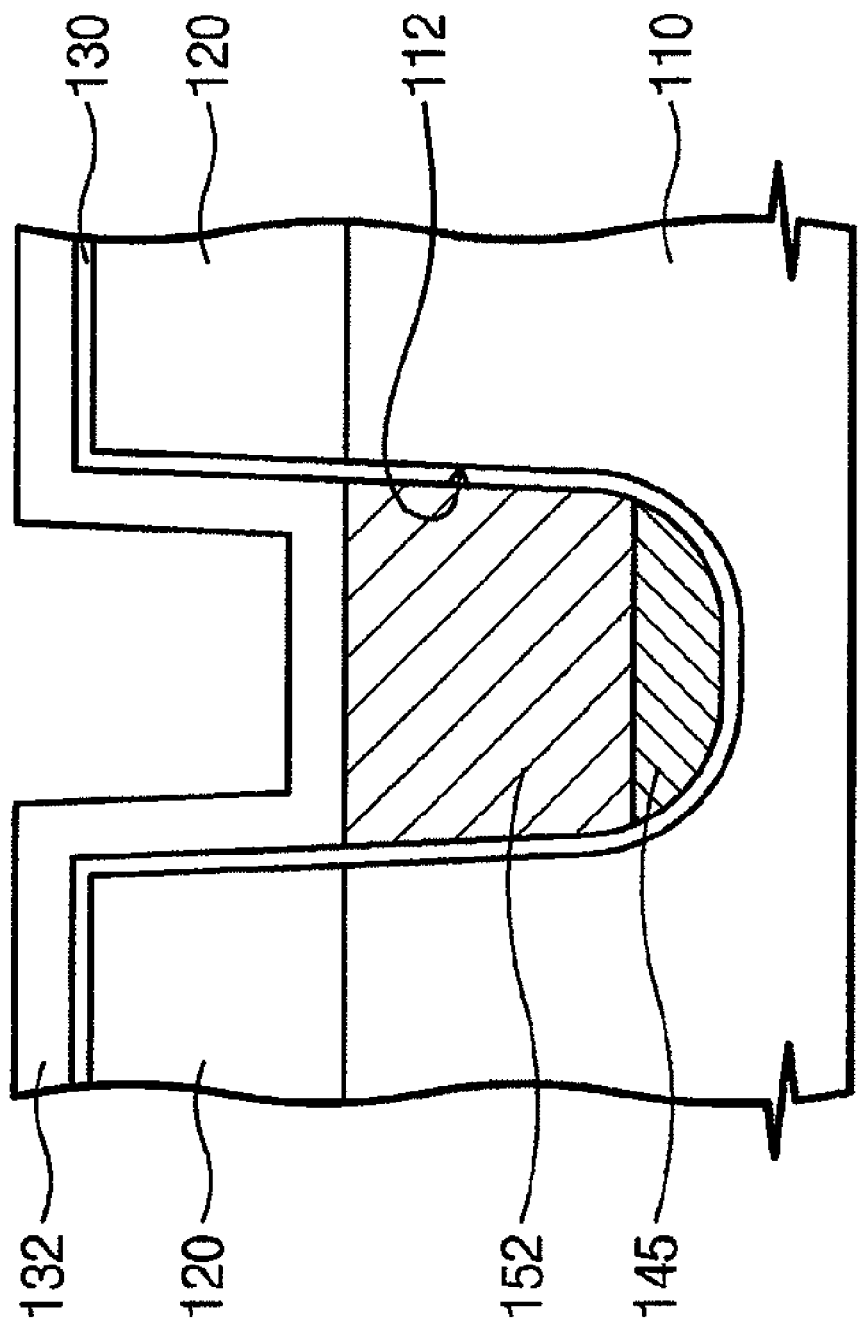

Referring to FIG. 8c, a spacer insulation layer material 132 is deposited on the second conductive layer pattern 152 to form a spacer. The spacer insulation material 132 may be formed using oxide or nitride.

Figure 8D:
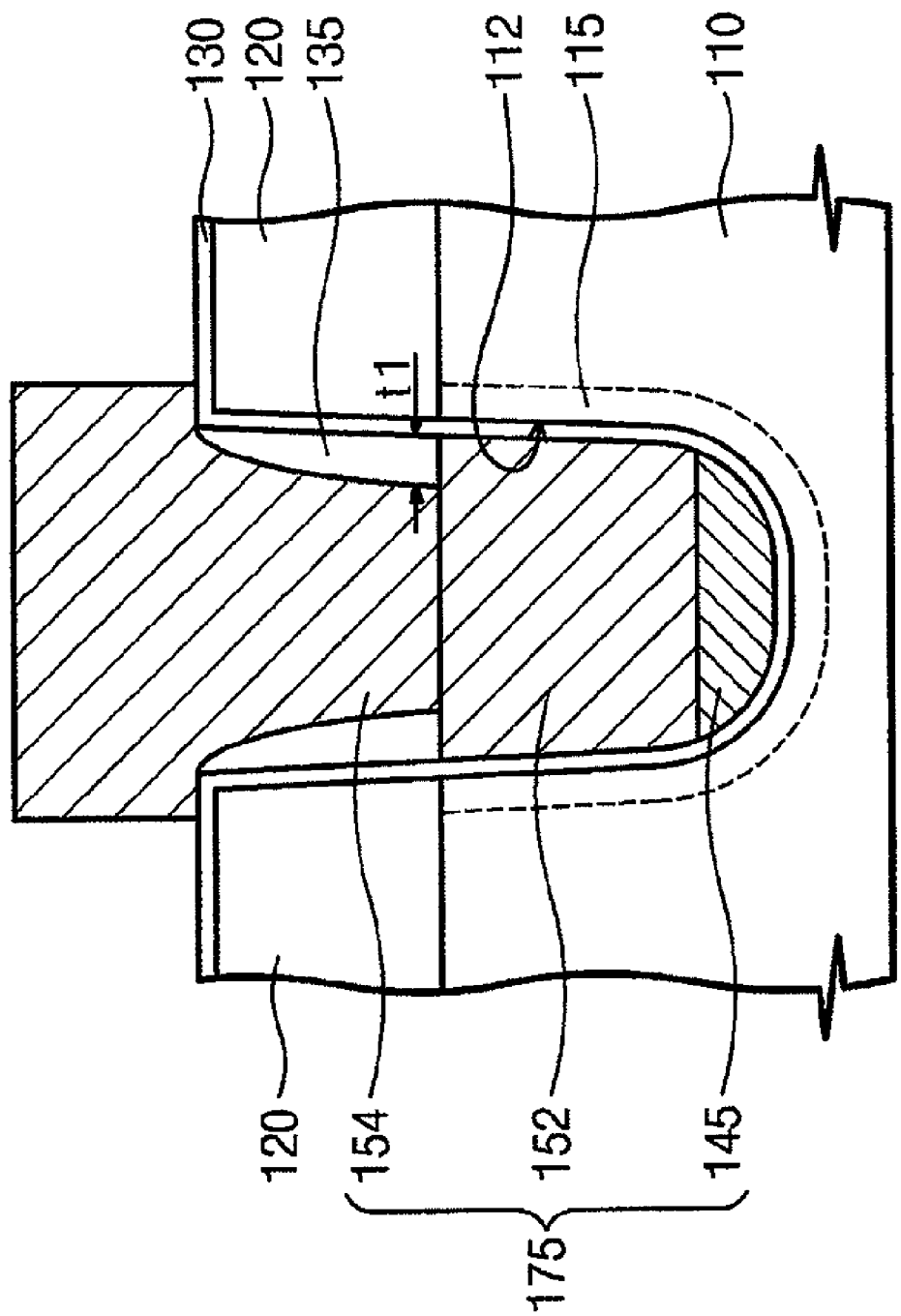

Referring to FIG. 8d, a third conductive layer pattern is to be formed by etch back of the spacer insulation material 132 to expose the second conductive layer pattern 152 and the gate insulation layer 130 above the source and drain layer 120, to form spacer insulation layer 135 adjacent the source and drain layer 120. A third conductive layer 154 is formed with a portion filling the recess and extending above the top of the gate insulation layer 130. The spacer insulation layer 135 according to this embodiment of the invention acts to improve electrical characteristics of the recess gate thus formed, including reducing GIDL between the third conductive layer 154 and the source and drain layer 120.

Figure 9:
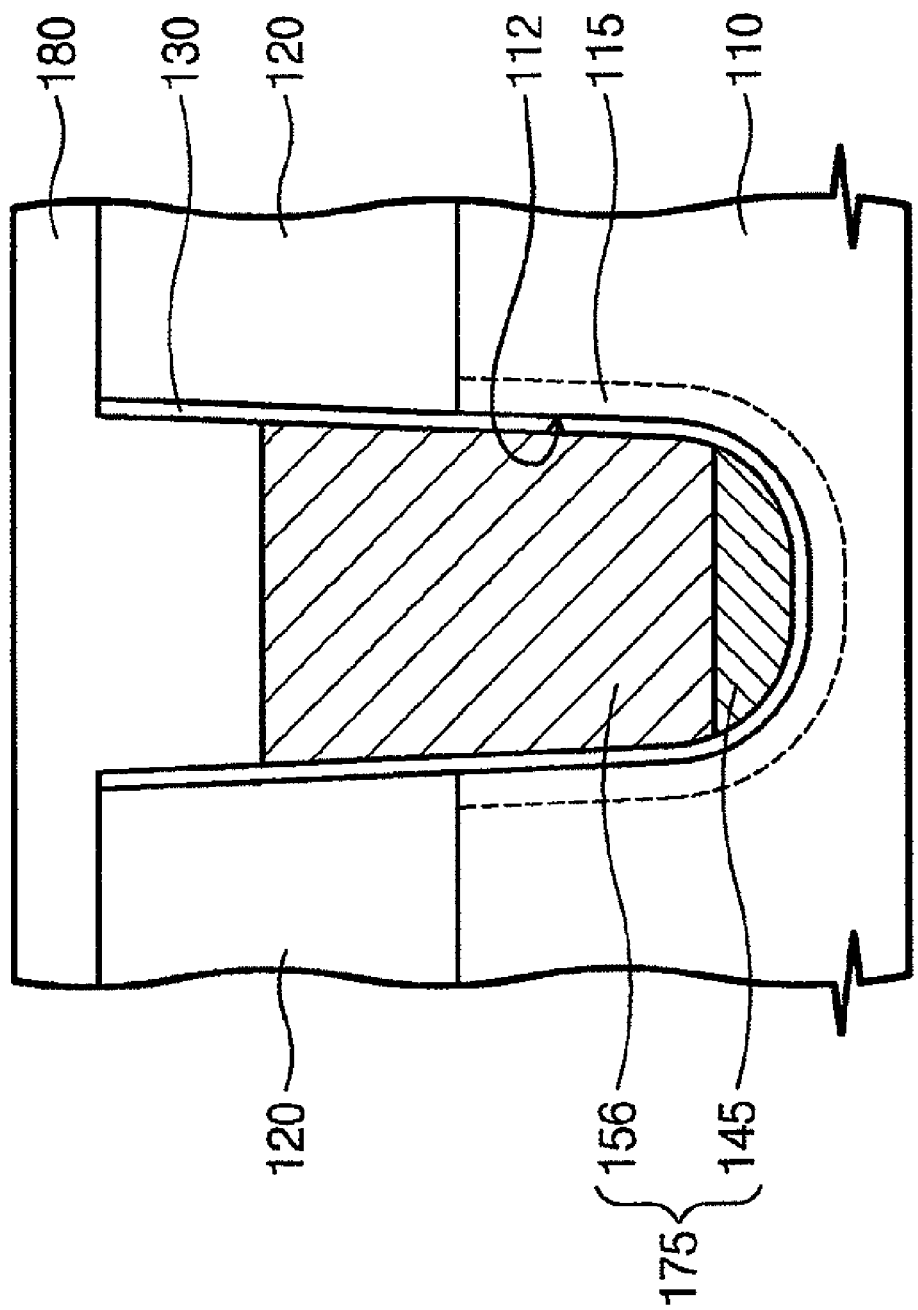
FIGS. 9 and 10 illustrate a method for forming a semiconductor device to which recess gates fabricated according to an exemplary embodiment of the present invention are applied.

Referring to FIG. 9, a process of forming a BCAT according to an embodiment of the present invention, a substrate 110 based on a semiconductor material such as silicon is first formed; a recess 112 is formed with a predetermined depth in a portion of the substrate 110; a source and drain layer 120 is formed on the substrate 110; then a gate insulation layer 130 is deposited along the sidewalls of the recess 112. A first conductive layer pattern 145 is obtained by filling the recess with a first conductive material and etching back the first conductive layer. The first conductive layer pattern 145 thus occupies the bottom portion of the recess 112. A second conductive layer pattern 156 is formed by filling the recess with a second conductive material above the first conductive layer pattern 145 and etching back, with its top surface at a height beneath the top of the source and drain layer 120. A capping insulation layer material 180 is deposited on the second conductive layer pattern 156 and above the source and drain layer 120. The capping insulation layer material can be an oxide, nitride, SiON, SixNy, or SiO2.

Figure 10:
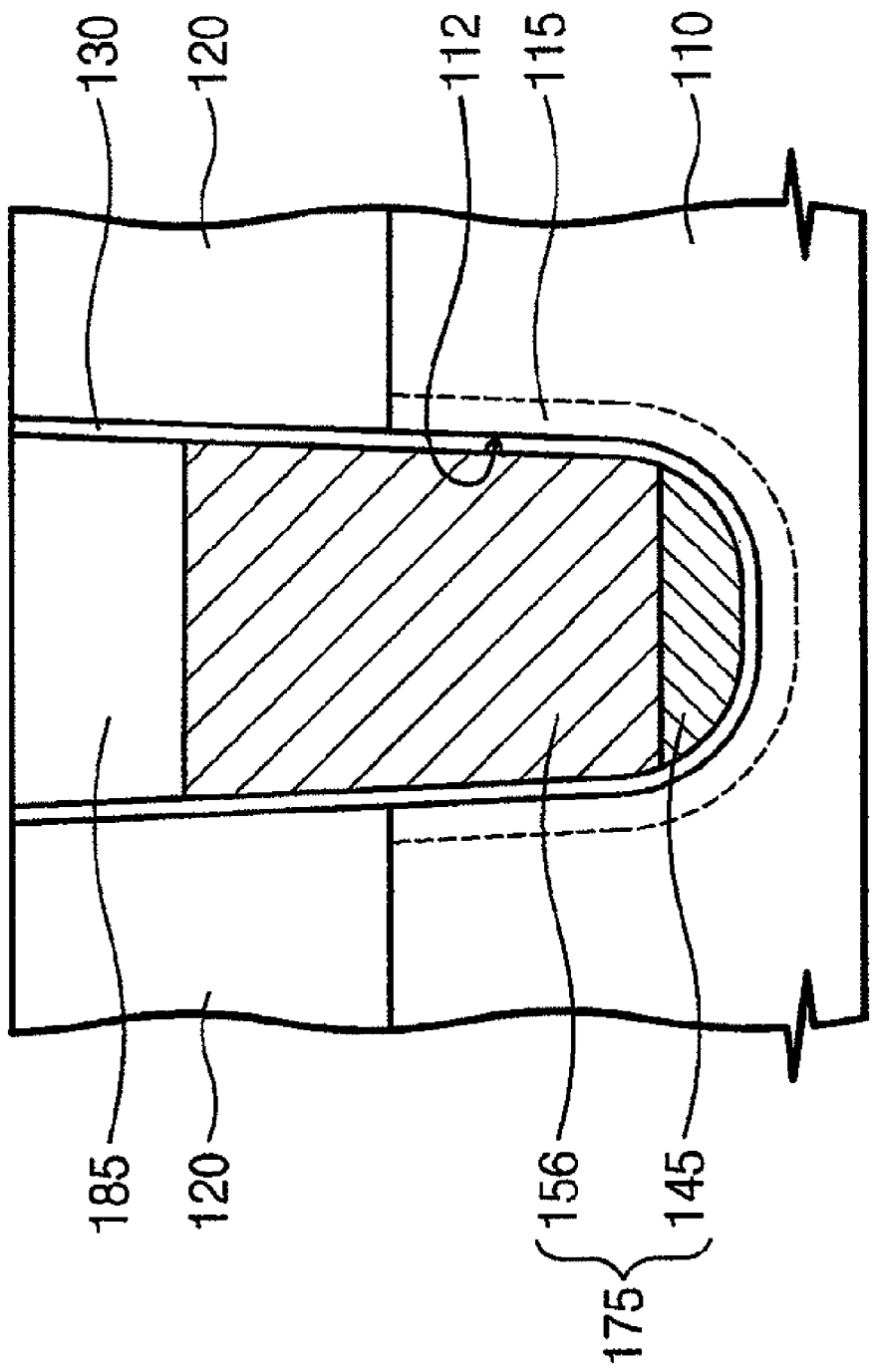

Referring to FIG. 10, a BCAT is obtained by planarizing the capping insulation layer material to form cap 185. As shown, the first and second conductive layer patterns are buried beneath the top of the source and drain region 120, covered by the cap 185. The planarization process can be by etchback, CMP, ALD, or like processes.

It is contemplated that a recess gate transistor according to preferred embodiments of the present invention heretofore described is utilized in semiconductor memory devices, which in turn are being applied to a number of applications, particularly when packaged in an enclosed card that is removably connected with a host system. Current commercial memory card formats include that of the Personal Computer Memory Card International Association (PCMCIA), CompactFlash (CF), MultiMediaCard (MMC) and Secure Digital (SD). Host systems with which such cards are used include personal computers, notebook computers, hand held computing devices, cameras, audio reproducing devices, and the like.

Figure 13:
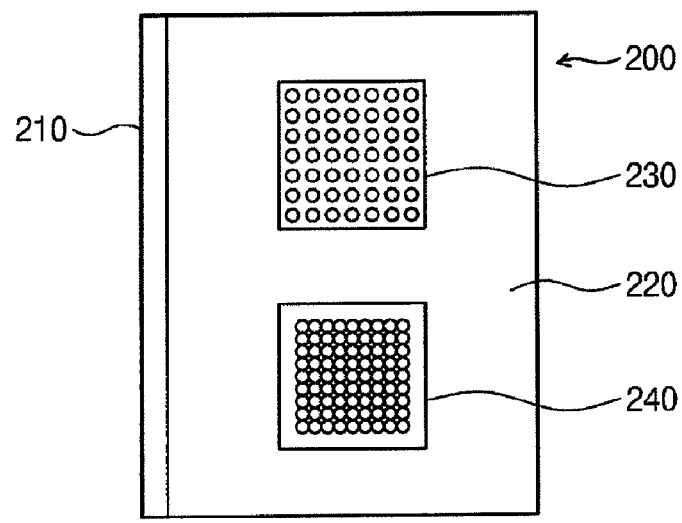
FIG. 13 shows a modular memory device having a semiconductor device according to an examplary embodiment of the present invention.

Referring to FIG. 13, a modular memory device including a semiconductor device according to examplary embodiments will be described. The modular memory device 200 may include a printed circuit board 220. The printed circuit board 220 may form one of the external surfaces of the modular memory device 200. The printed circuit board 220 may support a memory unit 230, a device interface unit 240, and an electrical connector 210.

The memory unit 230 having a recess gate transistor according to at least one embodiment of the present invention may include a three-dimensional memory array and may be connected to a memory array controller. The memory array may include the appropriate number of memory cells arranged in a three-dimensional lattice on the printed circuit board 220. The device interface unit 240 may be formed on a separated substrate such that the device interface unit 240 may be electrically connected to the memory unit 230 and the electrical connector 210 through the printed circuit board 220. Additionally, the memory unit 230 and the device interface unit 240 may be directly mounted on the printed circuit board 220. The device interface unit 240 may include components necessary for generating voltages, clock frequencies, and protocol logic.

Figure 14:
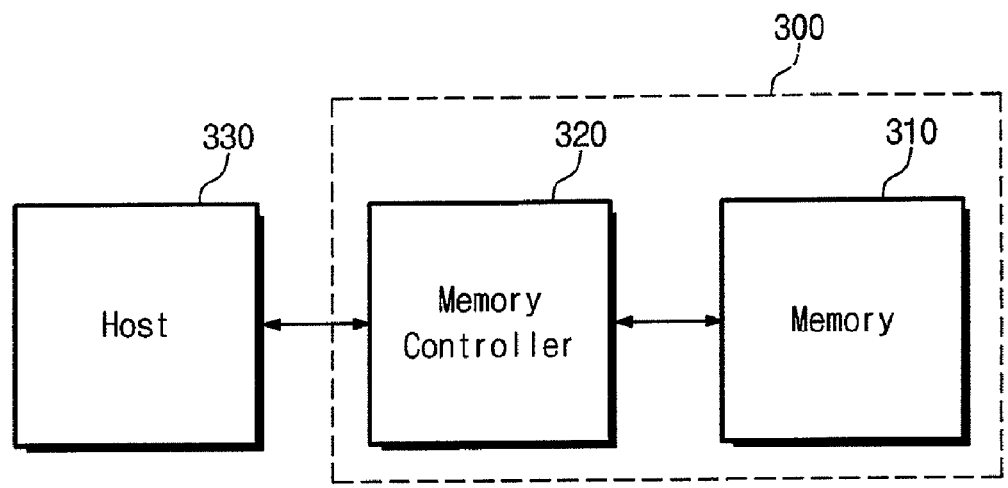
FIG. 14 shows a block diagram illustrating a memory system with a semiconductor device according to an examplary embodiment of the present invention.

Referring to FIG. 14, a memory system including a semiconductor device according to examplary embodiments will be described. A memory system 300 includes a memory controller 320 and a memory 310 having a recess gate transistor according to at least one embodiment of the present invention. The memory controller 320 controls the memory device 310 to read or write data from/into the memory 310 in response to a read/write request of a host 330. The memory controller 320 may include an address mapping table for mapping an address provided from the host 330 (e.g., mobile devices or computer systems) into a physical address of the memory device 310.

Referring to FIG. 1, an electron device including a semiconductor device according to examplary embodiments will be described. The electron device 400 may be used in a wireless communication device (e.g., a personal digital assistant, a laptop computer, a portable computer, a web tablet, a wireless telephone, a mobile phone and/or a wireless digital music player.) or in any device capable of transmitting and/or receiving information via wireless environments.

The electron device 400 includes a controller 410, an input/output (I/O) device 420 (e.g., a keypad, a keyboard, and a display), a memory 430 having a recess gate transistor according to at least one embodiment of the present invention, and a wireless interface 440. The controller 410 may include at least one of a microprocessor, a digital signal processor and a similar process. The memory 430 may be used to store commands executed by the controller 410, for example. The memory 430 may be used to store user data. The memory 430 includes a semiconductor device according to example embodiments. The electron device 400 may utilize the wireless interface 440 in order to transmit/receive data via a wireless communication network. For example, the wireless interface 440 may include an antenna and/or a wireless transceiver.

The electron device 400 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000.

While this invention has been described as having a preferred design, the present invention can be further modified within the spirit and scope of this disclosure. This application is therefore intended to cover any variations, uses, or adaptations of the present invention using the general principles disclosed herein. Furthermore, this application is intended to cover such departures from the present disclosure as come within the known or customary practice in the art to which this invention pertains and which fall within the limits of the appended claims.

The invention claimed is:

1. A method of forming a semiconductor device, comprising:
   providing a substrate;
   forming a source and drain layer;
   forming a recess and depositing a gate insulation layer therein;
   forming a first conductive layer on the gate insulation layer;
   forming a first conductive layer pattern by recessing the first conductive layer;
   forming a second conductive layer on the first conductive layer pattern;

forming a second conductive layer pattern by patterning the second conductive layer;

depositing an insulating layer on the second conductive layer pattern;

etching the insulating layer to expose the second conductive layer pattern and forming a spacer layer adjacent to the source and drain layer; and forming a third conductive layer on the second conductive layer pattern and the spacer layer.

2. The method of claim 1, wherein the first conductive layer pattern is metallic and the second conductive layer pattern is polysilicon.

3. The method of claim 1, wherein the first conductive layer pattern and the second conductive layer pattern are both metallic.

4. The method of claim 1, wherein the source and drain layer and the recess form a part of an NMOS device and the first conductive layer pattern has a workfunction equal to or greater than a workfunction of the second conductive layer pattern.

5. The method of claim 1, wherein the source and drain layer and the recess is part of a PMOS device and the first conductive layer pattern has a workfunction equal to or less than a workfunction of the second conductive layer pattern.

6. The method of claim 1, wherein the first conductive layer is selected from a group consisting of Ti, TiN, W, WN, Ta, TaN, Co, C, Rb, or Ru.

7. The method of claim 1, wherein the spacer layer is an oxide or a nitride.

8. The method of claim 1, wherein the first conductive layer pattern is a metal and the second conductive layer pattern is a polysilicon.

9. The method of claim 1, wherein the first conductive layer pattern and the second conductive layer pattern are both metallic.

* * * * *